United States Patent
Liufu

(10) Patent No.: US 7,494,602 B2
(45) Date of Patent: Feb. 24, 2009

(54) COMPOSITIONS FOR HIGH POWER PIEZOELECTRIC CERAMICS

(75) Inventor: De Liufu, Westfield, IN (US)

(73) Assignee: Piezotech, LLC, Indianapolis, IN (US)

( * ) Notice: Subject to any disclaimer, the term of this patent is extended or adjusted under 35 U.S.C. 154(b) by 275 days.

(21) Appl. No.: 11/374,744

(22) Filed: Mar. 14, 2006

(65) Prior Publication Data

US 2006/0255311 A1 Nov. 16, 2006

Related U.S. Application Data

(63) Continuation-in-part of application No. 11/104,374, filed on Apr. 11, 2005, now abandoned.

(51) Int. Cl.
*C04B 35/493* (2006.01)
*H01L 41/187* (2006.01)

(52) U.S. Cl. .............. 252/62.9 PZ; 501/134; 310/311; 310/358; 310/365

(58) Field of Classification Search ............. 264/435; 252/62.9 PZ; 501/134; 310/311, 358, 365
See application file for complete search history.

(56) References Cited

U.S. PATENT DOCUMENTS

| | | | |
|---|---|---|---|
| 4,948,767 A | 8/1990 | Ushida et al. | |
| 5,317,305 A | 5/1994 | Campman | |
| 5,759,433 A * | 6/1998 | Sasaki et al. ........... | 252/62.9 PZ |
| 5,849,211 A | 12/1998 | Hase et al. | |
| 6,140,746 A | 10/2000 | Miyashita et al. | |
| 6,391,814 B1 * | 5/2002 | Tsubokura et al. ........... | 501/136 |
| 6,440,324 B1 * | 8/2002 | Hayashi et al. ........ | 252/62.9 PZ |
| 6,765,335 B2 | 7/2004 | Wischnewskiy | |
| 6,882,089 B2 | 4/2005 | Kashiwaya et al. | |
| 2004/0156737 A1 | 8/2004 | Rakowski | |
| 2005/0178997 A1 | 8/2005 | Liufu | |

FOREIGN PATENT DOCUMENTS

EP 0344978 6/1989

OTHER PUBLICATIONS

Study of $Pb(Ni_{1/3},Nb_{2/3})O_3$—$Pb(Zr,Ti)O_3$ Solid Solutions Near Morphotropic Phase Boundary, G. Robert, M. Demartin and D. Damjanovic.

Structural compositional and piezoelectric properties of the sol-gei $Pb(Zr_{0.58}Ti_{0.44})_{0.80}(Mg_{1/3}Nb_{2/3})_{0.20}O_3/Pb(Zr_{0.56}Ti_{0.44})O_3$ composite films; K. Sumi, H. Qiu, H. Kamei, S. Moriya, M. Murai, M. Shimada, T. Nishiwaki, K. Takei, M. Hashimoto; 1999 Elsevier Science S.A.
Effects of uniaxial stress on dielectric properties lead magnesium niobate-lead zirconate titanate ceramics; R. Yimnirum, S. Ananta, E. Meechoowas, S. Wongsaenmai: Dept. of Physics, Chiang Mai Univ., Chiang Mal 50200 Thailand.
Mechanical Properties of $x$PMN-$(1-x)$PZT Ceramic Systems; R. Yimnirum, E. Meechoowas, S. Ananta and T. Tunkasiri; Dept. of Physics, Chiang Mai Univ., Chiang Mai 50200 Thailand.
Structure and the location of the morphotropic phase boundary region in $(1-x)[Pb(Mg_{1/3}Nb_{2/3})O_3]$-$x$PbTiO$_3$; A. Singh and D. Pandey; School of Materials and Technology, Institute of technology, Banaras Hindu Univ., Varanasi 221005, India.
Morphotropic phase boundary in $Pb(Nl_{1/3}Nb_{2/3})O_3$-$PbTiO_3$ solid solution system; K. Chen, C. Lei, X Zhang, J. Wang; Materials Science and Engineering B99 (92003) 487 490.
Morphotropic phase transition studies in $Pb(Zr_xTi_{1-x})O_3$ b far-infrared reflectance spectroscopy, V. Sivasubramanian, V R K Murthy, B. Viswanathan, M. Sieskind; Dept. of Physics, Indian Institute of Technology, Madras-13 600 036, India.
A document purported to be an English translation of JP 08119733.

* cited by examiner

*Primary Examiner*—C. Melissa Koslow
(74) *Attorney, Agent, or Firm*—Woodard, Emhardt, Moriarty, McNett & Henry LLP

(57) ABSTRACT

A class of ceramic compositions according to the formula $Pb_{(1-z)}M_z(Mn_{1/3}Sb_{2/3})_x(Zr_yTi_{1-y})_{1-x}O_3$ where M is selected to be either Sr or Ba, x is selected to be between 0.01 and 0.1, y is selected to be between 0.35 and 0.55, and z is selected to be between 0.01 and 0.10. In some embodiments of the above composition, one or more dopants is added to the compositions. The dopant(s) may be selected from the group comprising: $PbO$, $CeO_2$, $SnO_2$, $Sm_2O_3$, $TeO_2$, $MoO_3$, $Nb_2O_5$, $SiO_2$, $CuO$, $CdO$, $HfO_2$, $Pr_2O_3$, and mixtures thereof. The dopants can be added to the ceramic composition in individual amounts ranging from 0.01 wt % to up to 5.0 wt %. The preferred ceramic compositions exhibit one or more of the following electromechanical properties: a relative dielectric constant ($\in$) of between 1200 and 2000, a mechanical quality factor ($Q_m$) of between 1500 and 2800; a piezoelectric strain constant ($d_{33}$) of between 250-450 pC/N, a dielectric loss factor (tan δ) of between 0.002-0.008 and a thickness electromechanical coupling coefficient ($k_t$) of between 0.45 and 0.7.

10 Claims, No Drawings

COMPOSITIONS FOR HIGH POWER PIEZOELECTRIC CERAMICS

CROSS-REFERENCE TO RELATED APPLICATIONS

This application is a continuation-in-part of U.S. patent application Ser. No. 11/104,374, filed Apr. 11, 2005, now abandoned, which is incorporated herein by reference in its entirety.

FIELD OF THE INVENTION

The present invention relates generally to piezoelectric ceramic compositions, articles formed from these compositions, and to methods for preparing the piezoelectric ceramic compositions and articles.

BACKGROUND TO THE INVENTION

Piezoelectric elements are widely used in a variety of electronic components including ceramic resonators, ceramic filters, piezoelectric displacement elements, buzzers, transducers, ultrasonic receivers and ultrasonic generators, etc. As a result of the increased demand for piezoelectric elements, there is an increasing use of piezoelectric ceramic compositions to form the elements. There is a drive towards increasingly smaller electronic components, causing an increased demand for smaller piezoelectric elements for use in these electronic components.

However, many of the smaller electronic components require that the piezoelectric elements provide the same or even greater output power, despite their reduced size. The different uses or applications require different electromechanical characteristics from the piezoelectric ceramics. In order for piezoelectric ceramic elements to be used in high power applications, they must exhibit certain characteristics, including high mechanical quality factor ($Q_m$), a high relative dielectric constant ($\in$), and a high coercive field ($E_c$). Additionally, the dielectric loss factor (tan $\delta$) must be sufficiently low to minimize internal heating effects.

Existing high power piezoelectric ceramics often do not exhibit suitable electromechanical properties for use in miniaturized electronic devices. In the current state of the art, the existing piezoelectric elements that are sufficiently small to be used in the miniaturized devices exhibit low capacitance and high electrical impedance. This is inadequate to drive the miniaturized devices. Additionally, if the permittivity is high, the dielectric loss factor (tan $\delta$) of current piezoelectric elements is also high—resulting in internal heating and dissipative loss which significantly decreases the efficiency and output of the device. Consequently, existing piezoelectric ceramics have not provided adequate electromechanical properties for these miniaturized electronic devices.

The electromechanical properties of the piezoelectric ceramics can be altered by varying the specific ceramic composition, the molecular structure, and/or the methods and parameters for fabricating the piezoelectric ceramic.

In light of the above problems, there is a continuing need for advances in the relevant field including new piezoelectric ceramic compositions and piezoelectric elements formed from the compositions. The present invention addresses that need and provides a wide variety of benefits and advantages.

BRIEF SUMMARY OF THE INVENTION

Briefly describing one aspect of the present invention, there is provided a class of ceramic compositions illustrated by Formula 1 below:

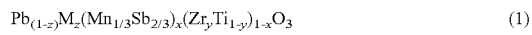

$$Pb_{(1-z)}M_z(Mn_{1/3}Sb_{2/3})_x(Zr_yTi_{1-y})_{1-x}O_3 \quad (1)$$

wherein M is selected to be either Sr or Ba, x is selected to be between 0.01 and 0.1, y is selected to be between 0.35 and 0.55, and z is selected to be between 0.01 and 0.10.

In some embodiment of the above composition, one or more dopants are added to the compositions. The dopants may be selected from the group comprising: PbO, $SnO_2$, $Sm_2O_3$, $TeO_2$, $MoO_3$, $Nb_2O_5$, $SiO_2$, CuO, CdO, $HfO_2$, $Pr_2O_3$, $CeO_2$, and mixtures thereof. The dopants can be added to the ceramic composition in individual amounts ranging from 0.01 wt % to up to 5.0 wt %.

Certain preferred ceramic compositions of the present invention exhibit suitable electromechanical properties for use as piezoelectric elements in high power applications. Certain preferred piezoelectric ceramics of the invention exhibit one or more of the following electromechanical properties: a relative dielectric constant ($\in$) of between 1200 and 2000, a mechanical quality factor ($Q_m$) of between 1500 and 2800; a piezoelectric strain constant ($d_{33}$) of between 250-450 pC/N, a dielectric loss factor (tan $\delta$) of between 0.002-0.008 and a thickness electromechanical coupling coefficient ($k_t$) of between 0.45 and 0.7. In some embodiments the ceramic has a relative dielectric constant ($\in$) of about 1500, a mechanical quality factor ($Q_m$) of about 2000, a piezoelectric strain constant ($d_{33}$) of about 350 pC/N, and a dielectric loss factor (tan $\delta$) of less than about 0.004.

It is an object of the present invention to provide high power piezoelectric ceramics.

Further objects, features, aspects, forms, advantages, and benefits shall become apparent from the description and drawings contained herein.

DETAILED DESCRIPTION

For the purposes of promoting an understanding of the principles of the invention, specific embodiments will be described. It will nevertheless be understood that no limitation of the scope of the invention is thereby intended. Any alterations and further modifications in the described compositions, elements, processes, or devices, and any further applications of the principles of the invention as described herein are contemplated as would normally occur to one skilled in the art to which the invention relates.

The present invention provides novel compositions of piezoelectric ceramics that have advantageous use for high power applications. Existing high power piezoelectric ceramics do not exhibit suitable electromechanical properties for use in miniaturized devices. With the miniature devices, the element sizes are often small causing the resulting capacitance of the piezoelectric ceramic to be too small and the electrical impedance too high for useful or adequate electrical driving of many electrical devices. In contrast, the preferred compositions of the present invention exhibit a high mechanical quality factor ($Q_m$), a high relative dielectric constant ($\in$), and a high coercive field ($E_c$). The mechanical quality factor is reciprocally related to the energy consumed by the material during the energy conversion; thus, the larger the mechanical quality factor, the smaller the amount of energy consumed during this conversion. A high coercive field allows users to drive devices with a very high electric field, resulting in high power. These properties provide a high capacitance, with better electrical impedance matching for high electrical driving. Additionally, the dielectric loss factor (tan δ) is sufficiently low to minimize internal heating effects, which can drain electrical power from the device and, in the worst case, cause the device to ultimately fail.

The preferred piezoelectric ceramics of the invention exhibit one or more of the following electromechanical properties: a relative dielectric constant (∈) of between 1200 and 2000, a mechanical quality factor ($Q_m$) of between 1500 and 2800; a piezoelectric strain constant ($d_{33}$) of between 250-450 pC/N, a dielectric loss factor (tan δ) of between 0.002-0.008 and a thickness electromechanical coupling coefficient ($k_t$) of between 0.45 and 0.7. In some preferred embodiments the ceramic has a relative dielectric constant (∈) of about 1500, a mechanical quality factor ($Q_m$) of about 2000, a piezoelectric strain constant ($d_{33}$) of about 350 pC/N, and a dielectric loss factor (tan δ) of less than about 0.004. Additionally, the perovskite ceramics of the present invention may have a Curie temperature value of between about 300° C. and about 400° C.

In some embodiments of the present invention, the piezoelectric ceramics may be used to form piezoelectric elements that can produce significantly greater amount of acoustical power than the current state-of-the-art high power piezoelectric ceramics having the same sized element. Alternatively, the present invention can provide piezoelectric ceramics for use in microelectronics and can be used to produce a much smaller element while providing the same acoustical power output as significantly larger elements.

The novel piezoelectric ceramic compositions of the present invention preferably have a composite perovskite crystal structure. In some preferred embodiments, the composite perovskite ceramic provides a unique crystal structure as a single-phase ceramic composition. The term "composite perovskite crystal structure," is intended to encompass ceramic compositions exhibiting a unique crystal structure prepared by combining the selected elements in a unique, stoichiometric ratio. In this structure, each element or type of element is located at a crystallographically predictable or determinable site, typically a lattice site within the crystal structure. Consequently, in one embodiment, the piezoelectric ceramic composition does not exhibit the same properties normally exhibited by a solid solution of metals, or metal oxides, in a ceramic matrix. In other embodiments, the preferred piezoelectric ceramic composition of the present invention exists as a composite perovskite crystal structure with one or more added dopants which may be located in the interstitial sites of the crystal lattice. The added dopants are discussed more fully below.

One preferred formula for the ceramic composition, which can be made piezoelectric according to the present invention is illustrated below in Formula 1:

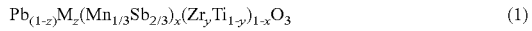   (1)

where M is selected to be either Sr or Ba, x is between 0.01 and 0.1, y is between 0.33 and 0.67, and z is between 0.01 and 0.1. In a preferred embodiment, x can be selected to be between about 0.03 and 0.07, y is selected to be between 0.40 and 0.60, and z is selected to be between 0.02 and 0.03.

In other preferred embodiments the piezoelectric material has a Curie temperature in excess of 260° C. In such embodiments the piezoelectric material may also exhibit suitable electromechanical properties for use in high power applications. For example, the piezoelectric material may be formulated to exhibit one or more of the following electromechanical properties: a free dielectric constant ($K^T_{33}$) of between 1200 and 2000 (preferably between about 1350 and about 1650, and most preferably at least about 1500), a relative dielectric constant (∈) of between 1200 and 2000 (preferably between about 1350 and about 1650, and most preferably at least about 1500), a mechanical Q (thickness) of between about 400 and about 1000 (preferably at least about 670), a mechanical Q (radial) of between about 1500 and 2800 (most preferably at least about 2000); a piezoelectric strain constant ($d_{33}$) of between about 250 and 450 pC/N (more preferably between about 290 and about 350, most preferably about 320 pC/N), a dielectric loss/dissipation factor (D) of between 0.002 and 0.008 (most preferably less than about 0.004), a thickness electromechanical coupling coefficient ($k_t$) of between 0.45 and 0.7 (most preferably between about 0.475 and about 0.530), a planar coupling coefficient ($k_p$) of at least about 0.3 (more preferably between about 0.58 and about 0.65, most preferably at least about 0.5); a longitudinal coupling coefficient ($k_{33}$) of at least about 0.7, a transverse coupling coefficient ($k_{31}$) of at least about 0.27 (more preferably between about 0.24 and about 0.3), and a Curie temperature of at least about 260° C., more preferably at least about 300° C., and most preferably at least about 320° C.

In some preferred embodiments the piezoelectric material is a PZT ceramic material having a base formula of:

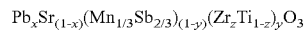

wherein x may range from 0.95 to 0.99;
wherein y may range from 0.92 to 0.97; and
wherein z may range from 0.45 to 0.55.

In one preferred embodiment the piezoelectric material is a PZT ceramic material having a base formula of:

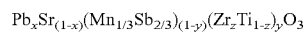

wherein x is about 0.96;
wherein y is about 0.94; and
wherein z is about 0.5.

One or more dopants may be included in the piezo ceramic material. Preferred dopants may be selected from the group consisting of: $CeO_2$, $CuO$, $PbO$, $SnO_2$, $Sm_2O_3$, $TeO_2$, $MoO_3$, $Nb_2O_5$, $SiO_2$, $CdO$, $HfO_2$, $Pr_2O_3$, and mixtures thereof. The dopants are preferably added to the ceramic composition in individual amounts ranging from 0.01 wt % to up to 5.0 wt %.

In one preferred embodiment the piezoelectric material is a PZT ceramic material having a base formula of:

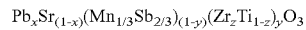

wherein x is about 0.96;
wherein y is about 0.94; and
wherein z is about 0.5; and wherein the material further includes dopants in the amounts of:
$CeO_2$ is about 0.4%;
$CuO$ is about 1%; and
$Nb_2O_5$ is about 4%.

In one embodiment the piezoelectric material is a PZT ceramic made as described herein from the following relative amounts of starting materials:

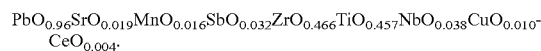

In one embodiment the piezoelectric material is a PZT ceramic made as described herein from the following relative amounts of starting materials:

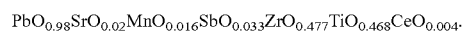

In one embodiment the piezoelectric material is a PZT ceramic made as described herein from the following relative amounts of starting materials:

$$PbO_{0.98}SrO_{0.02}MnO_{0.016}SbO_{0.033}ZrO_{0.476}TiO_{0.466}CuO_{0.006}CeO_{0.004}.$$

In one embodiment the piezoelectric material is a PZT ceramic made as described herein from the following relative amounts of starting materials:

$$PbO_{0.96}SrO_{0.0195}MnO_{0.016}SbO_{0.032}ZrO_{0.467}TiO_{0.457}NbO_{0.038}CuO_{0.006}CeO_{0.036}.$$

In one embodiment the piezoelectric material is a PZT ceramic made as described herein from the following relative amounts of starting materials:

$$PbO_{0.96}SrO_{0.0194}MnO_{0.016}SbO_{0.032}ZrO_{0.466}TiO_{0.457}NbO_{0.038}CuO_{0.0098}CeO_{0.0036}.$$

In one embodiment the piezoelectric material is a PZT ceramic made as described herein from the following relative amounts of starting materials:

$$PbO_{0.96}SrO_{0.0195}MnO_{0.016}SbO_{0.0322}ZrO_{0.467}TiO_{0.457}NbO_{0.0378}CuO_{0.002}CeO_{0.036}.$$

In one embodiment the piezoelectric material is a PZT ceramic made as described herein from the following relative amounts of starting materials:

$$PbO_a SrO_b MnO_c SbO_d ZrO_e TiO_f NbO_g CuO_h CeO_i$$

where a ranges between 0.95 and 0.97;
where b ranges between 0.015 and 0.025;
where c ranges between 0.015 and 0.018;
where d ranges between 0.03 and 0.04;
where e ranges between 0.45 and 0.5;
where f ranges between 0.45 and 0.5;
where g ranges between 0.35 and 0.4;
where h ranges between 0.005 and 0.015; and
where i ranges between 0.003 and 0.005.

In one embodiment the piezoelectric material is a PZT ceramic made as described herein from the following relative amounts of starting materials:

$$PbO_a SrO_b MnO_c SbO_d ZrO_e TiO_f NbO_g CuO_h CeO_i$$

where a ranges between 0.95 and 0.99;
where b ranges between 0.01 and 0.05;
where c ranges between 0.015 and 0.02;
where d ranges between 0.03 and 0.04;
where e ranges between 0.45 and 0.55;
where f ranges between 0.45 and 0.55;
where g ranges between 0.3 and 0.5;
where h ranges between 0.005 and 0.02; and
where i ranges between 0.003 and 0.005.

The preferred composition of the present invention can be prepared by selecting metal containing precursors and combining the metal containing precursors in a selected relative ratio to provide the desired stoichiometric composition of Formula 1 above. The above formula can be thought of as the perovskite structure of the $ABO_3$ type. In this formula type, the stoichiometric ratio of the A type element or component to the B type element or component is 1:1. In accordance with this construct, the metals Pb and M (where M is either strontium or barium) in Formula 1 above can be represented by the identifier A. Similarly, the identifier B can be represented by the combination of (Mn/Sb) and (Zr/Ti). Consequently for the present invention, the relative molar ratio of the A component, [Pb(Sr/Ba)], to the B component, [(Mn/Sb) and (Zr/Ti)], is about 1:1.

Within this construct, the relative atomic ratio of Pb to M (either Sr or Ba) can be selected and varied to provide a composition with the desired electromechanical properties. In a preferred embodiment, the relative atomic ratio of Mn to Sb is preselected to be about 1:2 Mn:Sb. The relative atomic ratio of Zr to Ti can range from 7:13 to 11:9 (Zr:Ti).

Further, the relative ratio of the (Mn/Sb) component to the (Zr/Ti) component can vary. In a preferred embodiment, the relative ratio of (Mn/Sb) to (Zr/Ti) can be varied or selected to be between 1:9 and 1:20.

As noted above, the relative ratios of the metals in the ceramic can be varied to affect the desired electromechanical properties. Preferably, the relative ratios are selected to provide a ceramic composition exhibiting a structure that lies near or at the morphotropic phase boundary (MPB) area. The MPB delineates two solid phases, e.g., a tetragonal phase and a rhombohedral phase, that remain in a near-equilibrium state over a wide temperature range.

The preferred metal precursors for the present invention are selected to be metal oxides or metal carbonates. Preferably, the metal precursors are available as $PbO$, $MgO$, $Nb_2O_5$, $ZrO_2$, and $TiO_2$. Additionally, $SrCO_3$ and $BaCO_3$ can be used as the precursors for Sr and Ba. These metal precursors are commercially available from a number of commercial vendors and in various levels of purity. It is preferred that the metal precursors be at least 99.95% pure.

In other embodiments, the ceramic of the present invention can include one or more dopant materials. The dopant materials can be selected to modify and enhance the electromechanical properties of the resulting piezoelectric ceramic. Alternatively, one or more of the dopants can be added to the precursors to facilitate and/or ease processing steps to formulate the desired ceramic. The dopants can be added to the present composition in individual amounts up to about 2 percent by weight (wt %) based upon the total weight of the starting, precursor material. If more than one dopant is used, the total amount of the dopants should not exceed 5 wt %. More preferably, the dopants are included in the ceramic compositions in combined amounts between 1.0 wt % and 4.0 wt % based upon the total weight of the starting, precursor materials. Examples of the dopants for use in the present invention include cerium, cesium, lead, tin, samarium, tellurium, molybdenum, niobium, silicon, copper, cadmium, hafnium, and praseodymium ceramics. More preferably, the dopants are provided by one or more of the following dopant precursors $CeO_2$, $PbO$, $SnO_2$, $Sm_2O_3$, $TeO_2$, $MoO_3$, $Nb_2O_5$, $SiO_2$, $CuO$, $CdO$, $HfO_2$, $Pr_2O_3$. Some preferred composition include between 0.8 wt % and 1.2 wt % PbO, based upon the total weight of the starting precursor. Preferred compositions also include 0.2 wt % $CeO_2$, again, based upon the total weight of the starting precursor. Additional preferred compositions include between 0.05 wt %-0.25 wt % CuO. Still other preferred composition include 1.6 wt % $Nb_2O_5$.

In other embodiments, one or more different piezoelectric compositions (such as PZT4, PZT8, a composite variety, a single crystal of piezoelectric, and/or a piezoelectric polymer just to name a few non-limiting examples) can be alternatively, or additionally, utilized for the present invention as would occur to those skilled in the art.

These piezoelectric ceramics can be prepared by slurrying the selected powdered metal precursors in a liquid such as water or an alcohol. The suspended powder is pulverized in a ball mill until the mixed slurry is homogeneous and has a sufficiently small particle size. The resulting pulverized mixture is dried, preferably in an oven at elevated temperatures between about 100 and 150° C.

The resulting powder is thermally treated, or calcined, to form the desired perovskite structure. Preferably, the pulverized powder is heated to a selected temperature less than 1050° C., more preferably to a temperature between 700° C. to 1000° C., still more preferably between 800° C. and 975° C., and most preferably at about 950° C. The powder is slowly heated to the selected temperature over a period of time. The heating rate can be varied considering the powder mass, the components in the powder, and the desired application for the final piezoceramic component. Preferably the powder is heated at a rate between about 100° C. and about 220° C. per hour, more preferably at a rate of between about 125° C. and 200° C. per hour, still more preferably at a rate of between about 150° C. and 190° C. per hour. Thereafter, the powder is held at the selected temperature for a time period. Again, the time period or hold time can be varied depending on the mass, identity, and amount of the components in the powder. Typically the powder is held at the selected temperature for a hold time between 1 and 10 hours, more preferably between 2 and 5 hours, and most preferably for about 3 hours. After this thermal treatment, the powder is allowed to cool to room temperature.

The calcined powder is re-pulverized in a ball mill as has been described above and then dried. This re-pulverized ceramic is then blended with a binder to provide a paste with the pulverized ceramic suspended in the paste. This paste is molded, pressed, or extruded as desired into a shaped article, alternatively referred to herein as a green article. For example, the shaped article can be molded into the shape of a generally parallel piped block or a round disk or any other desired shape. The binder can be removed from the article either by heating to evaporate the binder, heating to a higher temperature to decompose the binder or, more preferably, by using a solvent to dissolve the binder material. The solvent can be any desired solvent, preferably an organic solvent, into which the binder material exhibits a suitably high solubility. Typical solvents include alcohols, acetone, chloroform, methylene chloride, and other polar organic solvents that exhibit a relatively low boiling point or high vapor pressure. A preferred organic solvent in this case is polyvinyl alcohol (PVA).

The green article is then sintered or fired at an elevated temperature range. The green article is placed in a suitable container such as an alumina crucible and additional (unmolded) ceramic powder is placed around the shaped article during the firing process. The elevated temperature range can be selected to be between 900° C. and 1350° C., more preferably between about 1000° C. and 1300° C. and most preferably between 1200° C. and 1290° C. The article can be held at one or more selected temperatures within that temperature range for a time between about 10 and about 25 hours. More preferably, the article is slowly heated through the elevated temperature range at a selected heating rate. The heating rate can be selected by considering the mass or volume of the green article, the constituents in the ceramic, and the desired properties of the piezoceramic article. After the firing process, the article comprising the ferroelectric ceramic can be cooled to ambient temperature.

The ceramic article comprising the ferroelectric ceramic is then poled at about 70 to about 80 V per mil thickness of the article at a desired temperature or temperature range to provide the piezoelectric ceramic article. In one embodiment, the desired temperature is selected to be between 100° C. and 140° C.

In other embodiments, one or more different procedures for making the piezoelectric ceramic and/or or one or more different piezoelectric compositions (such as PZT4, PZT8, a composite variety, a single crystal of piezoelectric, and/or a piezoelectric polymer just to name a few non-limiting examples) can be alternatively, or additionally, utilized for the present invention as would occur to those skilled in the art.

Additionally, the electrode deposition and poling can be performed differently than that in the above described in connection with other processes.

For example, poling electrode deposition on the ceramic article can be accomplished by sputtering or screen printing processes. Typically, the electrodes are deposited on the opposing faces of the article. In one form, the electrode metallization includes low temperature sputtering of gold or an alloy thereof; however, other deposition processes and/or materials suitable for electrode formation can be utilized in different embodiments.

The ceramic of the article is poled (polarized). Polarization can be accomplished by subjecting the ceramic article to the following regime: (a) a slow ramp-up to an elevated temperature, (b) a slow ramp-up of a polarizing electric field (voltage) across the electrodes while maintaining the elevated temperature, (c) a slow ramp-down to room temperature while the field is maintained, and (d) a slow ramp down of the electric field while at room temperature. Temperature changes are performed at a rate of about 1° C. per minute and voltage changes are gradual to a maximum of about 50-80 volts per mil thickness of material with a dwell time at maximum temperature and voltage of about 5 minutes. Performance parameters of the piezoelectric ceramic are tested after poling. If desired at this stage, or at another stage of the process, the poling electrodes can be removed.

The resulting piezoelectric ceramic can be further processed as desired. In one form, the piezoelectric ceramic is used as a monolithic ceramic or billet for a particular device. Electrodes can be patterned on monolithic ceramic to provide a single piezoelectric element. In other embodiments, two, three, or more piezoelectric ceramic articles can be combined or laminated together. Each of the laminates typically contains separate electrodes. The laminate elements can be used to form a device such as actuators or projectors. In yet other embodiments, the piezoelectric ceramic can either be cut into a number of smaller units or combined with a number of different piezoelectric ceramics that either have the same or different electromechanical properties. Electrodes can be patterned on each of the smaller units or different piezoelectric ceramics, which can be combined to form a multi-element array.

In any of these applications, electrodes are deposited on the piezoelectric ceramic positioned and sized for the particular use of the resulting electronic device. Examples of electronic devices that can utilize the piezoelectric ceramics of the present invention are described and illustrated in U.S. patent application Ser. No. 10/686,120 filed on Oct. 15, 2003 (now abandoned), and entitled "Miniature Ultrasonic Phased Array for Intracardiac and Intracavity Application;" U.S. Provisional Patent Application Ser. No. 60/478,649, filed on Jun. 13, 2003, and entitled "Multi-Element Array for Acoustic Ablation"; and U.S. patent application Ser. No. 10/475,144, filed on Jun. 1, 2003 (now abandoned), and entitled "Droplet Generation with a Piezoelectric Device," all of which are incorporated by reference herein in their entirety.

For the purpose of promoting further understanding and appreciation of the present invention and its advantages, the following Examples are provided. It will be understood, however, that these Examples are illustrative and not limiting in any fashion.

For the following examples, the measurements were performed on a computer-controlled Hewlett-Packard 4149A impedance/gain-phase analyzer. The measured parameters were a dielectric constant (K'), a dielectric loss factor (tan δ), a mechanical quality factor ($Q_m$), relative permittivity (∈) (∈=K'−1~=K'), a thickness coupling coefficient ($K_t$), and a planar coupling coefficient ($K_p$). The density of the ceramic samples was measured by weighing the individual samples and determining the volume of the individual samples. The Berlincourt $d_{33}$ meter was used to determine the piezoelectric strain constant.

EXAMPLE 1

The following powdered ceramics were combined: PbO, 683.7 g; $ZrO_2$, 183.3 g; $TiO_2$, 116.2 g; $Sb_2O_3$, 14.96 g; MnO, 4.46 g; SrCO$_3$, 9.17 g; and CeO$_2$, 2.0 g. This combination of powders includes 1 wt % PbO, 0.2 wt % CeO$_2$ as dopant precursors.

The powders were suspended in 900 ml of deionized water and ball milled for about 16 hours. The resulting powdered slurry was then dried at 130° C. The dried powder was calcined at 950° C. for 3 hours. Thereafter the calcined ceramic powder was cooled to ambient temperature. The resulting ceramic was then re-pulverized by suspending in 700 ml of deionized water and ball milling for 16 hours. The pulverized ceramic was again dried at 130° C. to evaporate the water. The dried powder was suspended in a 5% polyvinyl alcohol (PVA) solution to provide a paste. This paste was extruded through a 1 7/16" slotted die under 2000 lb force to form a ceramic billet. This ceramic billet was fired at 1270° C. for 2.5 hours to produce the ferroelectric ceramic. Thereafter the ceramic billet was cooled to ambient temperature.

Silver electrodes were patterned on the ceramic billet according to standard procedures. The resulting billet was then poled (polarized) at 100° C.-140° C. and 70-80 V/mil for about 10 minutes. The electromechanical properties of the resulting piezoelectric ceramic were evaluated and are listed below in Table 1.

EXAMPLE 2

The same powdered ceramics as described in Example 1 were combined and 0.15% of CuO as a dopant precursor was added. The powders were then suspended in 900 ml of deionized water and ball milled for about 16 hours. The resulting powdered slurry was then dried at 130° C. The dried powder was calcined at 950° C. for 3 hours. Thereafter calcined ceramic powder was cooled to ambient temperature. The resulting ceramic was then re-pulverized by suspending in 500 ml of deionized water and ball milling for 16 hours. The pulverized ceramic was again dried at 120° C. to evaporate the water. The dried powder was suspended in a 5% polyvinyl alcohol (PVA) solution to provide a paste. This paste was extruded through a 1.115" slotted die under 1500 lb. force to form a ceramic billet, which was then "bisqued" at 600° C. in a kiln. This ceramic billet was fired at 1285° C. for 2.5 hours. Thereafter the ceramic billet was cooled to ambient temperature. Silver electrodes were patterned on the ceramic billet according to standard procedures. The resulting billet was then poled (polarized) at 100° C.-140° C. and 70-80 V/mil for about 10 minutes. The electromechanical properties of the resulting piezoelectric ceramic were evaluated and are listed below in Table 1.

EXAMPLE 3

The same powdered ceramics as described in Example 1 were combined and 0.15% of CuO and 1.6% of Nb$_2$O$_5$ as dopant precursors were added. The powders were then suspended in 900 ml of deionized water and ball milled for about 16 hours. The resulting powdered slurry was then dried at 130° C. The dried powder was calcined at 950° C. for 3 hours. Thereafter calcined ceramic powder was cooled to ambient temperature. The resulting ceramic was then re-pulverized by suspending in 750 ml of deionized water and ball milled for 16 hours. The pulverized ceramic was again dried at 130° C. to evaporate the water. The dried powder was suspended in a 5% polyvinyl alcohol (PVA) solution to provide a paste. This paste was extruded through a 1½" slotted die under 2000 lb. force and "bisqued" as described in Example 2 above to form a ceramic billet. This ceramic billet was fired at 1285° C. for 2.5 hours. Thereafter the ceramic billet was cooled to ambient temperature.

Silver electrodes were patterned on the ceramic billet according to standard procedures. The resulting billet was then poled (polarized) at 100° C.-140° C. and 70-80 V/mil for about 10 minutes. The electromechanical properties of the resulting piezoelectric ceramic were evaluated and are listed below in Table 1.

EXAMPLE 4

The following powdered ceramics were combined: PbO, 683.7 g; ZrO$_2$, 183.3 g; TiO$_2$, 116.2 g; Sb$_2$O$_3$, 14.96 g; MnO, 4.46 g; SrCO$_3$, 9.17 g; CeO$_2$, 2.0 g; Nb$_2$O$_5$, 16.0 g; and CuO 2.5 g. This combination of powders includes 1 wt % PbO, 0.2 wt % CeO$_2$, 0.25 wt % CuO and 1.6 wt % Nb$_2$O$_5$ as dopant precursors.

The powders were suspended in 900 ml of deionized water and ball milled for about 16 hours. The resulting powdered slurry was then dried at 130° C. The dried powder was calcined at 950° C. for 3 hours. Thereafter the calcined ceramic powder was cooled to ambient temperature. The resulting ceramic was then re-pulverized by suspending in 700 ml of deionized water and ball milled for 8 hours. The pulverized ceramic was again dried at 130° C. to evaporate the water. The dried powder was suspended in a 5% polyvinyl alcohol (PVA) solution to provide a paste. This paste was extruded through a 1.115" slotted die under 1000 lb force and "bisqued" as described in Example 2 above to form a ceramic billet. This ceramic billet was fired at 1290° C. for 2.5 hours to produce the ferroelectric ceramic. Thereafter the ceramic billet was cooled to ambient temperature.

Silver electrodes were patterned on the ceramic billet according to standard procedures. The resulting billet was then poled (polarized) at 100° C.-140° C. and 70-80 V/mil for about 10 minutes. The electromechanical properties of the resulting piezoelectric ceramic were evaluated and are listed below in Table 1.

EXAMPLE 5

The following powdered ceramics were combined: PbO, 683.7 g; ZrO$_2$, 183.3 g; TiO$_2$, 116.2 g; Sb$_2$O$_3$, 14.96 g; MnO, 4.46 g; SrCO$_3$, 9.17 g; and CeO$_2$, 2.0 g; Nb$_2$O$_5$, 16.0 g; CuO 0.5 g; and SnO$_2$ 2.0 g. This combination of powders includes 1 wt % PbO, 0.2 wt % CeO$_2$, 0.25 wt % CuO, 1.6 wt % Nb$_2$O$_5$, and 0.2 wt % SnO$_2$ as dopant precursors.

The powders were suspended in 900 ml of deionized water and ball milled for about 16 hours. The resulting powdered slurry was then dried at 130° C. The dried powder was calcined at 950° C. for 3 hours. Thereafter the calcined ceramic powder was cooled to ambient temperature. The resulting ceramic was then re-pulverized by suspending in 900 ml of deionized water and ball milled for 16 hours. The pulverized ceramic was again dried at 130° C. to evaporate the water. The dried powder was suspended in a 5% polyvinyl alcohol (PVA) solution to provide a paste. This paste was extruded through a 1.115" slotted die under 1500 lb force and "bisqued" as described in Example 2 above to form a ceramic billet. This ceramic billet was fired at 1290° C. for 2.5 hours to produce the ferroelectric ceramic. Thereafter the ceramic billet was cooled to ambient temperature.

Silver electrodes were patterned on the ceramic billet according to standard procedures. The resulting billet was then poled (polarized) at 100° C.-140° C. and 70-80 V/mil for about 10 minutes. The electromechanical properties of the resulting piezoelectric ceramic were evaluated and are listed below in Table 1.

TABLE 1

| Example | Density ρ g/ml | Relative Dielectric Constant ε (F/m) | Mechanical Quality Factor $Q_m$ | Piezoelectric Strain Constant $d_{33}$ (pC/N) | Dielectric Loss Factor tan δ | Coupling Constant $K_t$ | Planar Coupling Constant $K_p$ |
|---|---|---|---|---|---|---|---|
| 1 | 7.75 | 1531 | 1940 | 350 | 0.004 | 0.50 | 0.65 |
| 2 | 7.91 | 1267 | 1680 | 268 | 0.005 | 0.42 | 0.53 |
| 3 | 7.94-7.97 | 1550 | 1841 | 335 | 0.005 | 0.50 | 0.58 |
| 4 | 7.86 | 1494 | 1985 | 317 | 0.004 | 0.49 | 0.58 |
| 5 | 7.92 | 1556 | 1515 | 326 | 0.003 | 0.50 | 0.58 |

The present invention contemplates modifications as would occur to those skilled in the art. It is also contemplated that fabrication processes embodied in the present invention can be altered, rearranged, or added to other processes as would occur to those skilled in the art without departing from the spirit of the present invention. All publications, patents, and patent applications cited in this specification are herein incorporated by reference as if each individual publication, patent, or patent application was specifically and individually indicated to be incorporated by reference and set forth in its entirety herein. Further, any theory of operation, proof, or finding stated herein is meant to further enhance understanding of the present invention and is not intended to make the scope of the present invention dependent upon such theory, proof, or finding.

While the invention has been illustrated and described in detail and foregoing examples, the same is considered to be illustrative and not restrictive in character, it is understood that only the preferred embodiments have been shown and described and that all changes and modifications that come within the spirit of the invention are desired to be protected.

The invention claimed is:

1. A PZT ceramic material having a base formula of:

$$Pb_xSr_{(1-x)}(Mn_{1/3}Sb_{2/3})_{(1-y)}(Zr_zTi_{1-z})_yO_3$$

wherein x is about 0.96;
wherein y is about 0.94; and
wherein z is about 0.5; and
wherein the material further includes dopants in the amounts of:
$CeO_2$ is about 0.4%;
CuO is about 1%; and
$Nb_2O_5$ is about 4%.

2. A PZT ceramic material having a base formula of:

$$Pb_xM_{(1-x)}(Mn_{1/3}Sb_{2/3})_{(1-y)}(Zr_zTi_{1-z})_yO_3$$

wherein M is Sr;
wherein x is in the range of 0.95 to 0.99;
wherein y is in the range of 0.92 to 0.97; and
wherein z is in the range of 0.45 to 0.55;
wherein said composition further includes one or more dopants selected from the group consisting of: PbO, $CeO_2$, $SnO_2$, $Sm_2O_3$, $TeO_2$, $MoO_3$, $Nb_2O_5$, $SiO_2$, CuO, CdO, $HfO_2$, $Pr_2O_3$, and mixtures thereof.

3. A composition according to claim 2 wherein the total amount of said dopant(s) is between 1.0% and 4.0% by weight.

4. A composition according to claim 2 wherein said composition includes between 0.01 wt % and 5.0 wt. % PbO, between 0.01 wt % and 5.0 wt. % $CeO_2$, between 0.01 wt % and 5.0 wt. % $Nb_2O_5$, and between 0.01 wt % and 5.0 wt. % CuO.

5. A piezoelectric element comprising a ceramic material according to claim 2, wherein the ceramic exists as a perovskite structure having electric dipoles; and further wherein the electric dipoles of the ceramic have been aligned and at least two electrodes are formed thereon.

6. A PZT-type piezoelectric ceramic composition consisting essentially of Pb, Sr, Mn, Sb, Zr, Ti and Ce in the following relative amounts:

$$Pb_{0.98}Sr_{0.02}Mn_{0.016}Sb_{0.03}Zr_{0.48}Ti_{0.47}Ce_{0.004}.$$

7. A PZT-type piezoelectric ceramic composition consisting essentially of Pb, Sr, Mn, Sb, Zr, Ti, Ce and Cu in the following relative amounts:

$$Pb_{0.98}Sr_{0.02}Mn_{0.016}Sb_{0.03}Zr_{0.48}Ti_{0.47}Ce_{0.004}Cu_{0.006}.$$

8. A PZT-type piezoelectric ceramic composition consisting essentially of Pb, Sr, Mn, Sb, Zr, Ti, Ce, Cu and Nb in the following relative amounts:

$$Pb_{0.96}Sr_{0.02}Mn_{0.016}Sb_{0.03}Zr_{0.47}Ti_{0.46}Ce_{0.004}Cu_{0.006}Nb_{0.04}.$$

9. A PZT-type piezoelectric ceramic composition consisting essentially of Pb, Sr, Mn, Sb, Zr, Ti, Ce, Cu and Nb in the following relative amounts:

$$Pb_{0.96}Sr_{0.02}Mn_{0.016}Sb_{0.03}Zr_{0.47}Ti_{0.46}Ce_{0.004}Cu_{0.01}Nb_{0.04}.$$

10. A PZT-type piezoelectric ceramic composition consisting essentially of Pb, Sr, Mn, Sb, Zr, Ti, Ce, Cu, Nb and Sn in the following relative amounts:

$$Pb_{0.96}Sr_{0.02}Mn_{0.016}Sb_{0.03}Zr_{0.47}Ti_{0.46}Ce_{0.004}Cu_{0.002}Nb_{0.04}Sn_{0.004}.$$

* * * * *